United States Patent [19]

Fassel et al.

[11] Patent Number: 4,803,590
[45] Date of Patent: Feb. 7, 1989

[54] ELECTRIC SWITCHING DEVICE

[75] Inventors: Reinhard Fassel, Oberasbach; Georg Haubner, Berg; Hartmut Zöbl, Fürth/Bay, all of Fed. Rep. of Germany

[73] Assignee: Robert Bosch GmbH, Stuttgart, Fed. Rep. of Germany

[21] Appl. No.: 41,084
[22] PCT Filed: Mar. 14, 1986
[86] PCT No.: PCT/DE86/00110
 § 371 Date: Mar. 23, 1987
 § 102(e) Date: Mar. 23, 1987
[87] PCT Pub. No.: WO87/01007
 PCT Pub. Date: Feb. 12, 1987

[30] Foreign Application Priority Data

Jul. 30, 1985 [DE] Fed. Rep. of Germany ....... 3527208

[51] Int. Cl.4 ............................................. H05K 7/20
[52] U.S. Cl. ..................................... 361/386; 357/81; 361/388
[58] Field of Search ............................... 165/803, 185; 174/16 HS; 357/76, 81; 361/386–387, 395, 399, 424; 439/485, 487

[56] References Cited

U.S. PATENT DOCUMENTS

| 2,759,133 | 8/1956 | Mueller | 357/81 |
| 3,390,226 | 6/1968 | Beyerlein | 174/16 HS |
| 3,549,783 | 12/1970 | Bendrick | 361/389 |
| 3,846,823 | 11/1974 | Matthews et al. | 357/76 |
| 3,987,344 | 10/1976 | Ambruoso et al. | 439/487 |
| 4,266,267 | 5/1981 | Ruegg | 361/386 |
| 4,646,203 | 2/1987 | Ngo et al. | 361/388 |
| 4,675,784 | 6/1987 | Dahlberg et al. | 361/387 |

OTHER PUBLICATIONS

Balderes et al., "Heat Dissipation from IC Chips through Module Package", IBM Technical Disclosure Bulletin, vol. 19, No. 11, 4/77, pp. 4165–4166.

Primary Examiner—A. D. Pellinen
Assistant Examiner—Gregory D. Thompson
Attorney, Agent, or Firm—Michael J. Striker

[57] ABSTRACT

An electrical switching device includes a hermetically sealed housing enclosing at least one power switching component mounted on a cooling plate and a plurality of connector parts which are guided out of the housing. In order to eliminate heat generated by the switching component, portions of the connector parts within the housing are embedded in a heat conducting, electrically insulating material which is in contact with the cooling plate such that the heat is abducted via the cooling plate, the heat conducting material and the connector parts by a heat conducting and electrically insulating foil.

10 Claims, 2 Drawing Sheets

ELECTRIC SWITCHING DEVICE

BACKGROUND OF THE INVENTION

The invention is based on an electric switching device including a power switching component arranged in a completely insulated housing. In watertight electronic devices, it is known from the German design Patent Publication No. DE-CM No. 79 09 986 to guide the heat outward by means of cooling plates, the heat being generated in the power switching components arranged on the cooling plates. The plots are used simultaneously for fastening the switching device. In electrical devices having a fully insulated housing, it is known to guide the heat from power transistors and power resistors directly to a connector plug by means of a cooling plate or to construct the cooling plate and connection plug as a structural connector part, by means of which the heat is guided outward and conducted away by a connecting cable harness having good heat conduction and large surface. This solution has been proven particularly in regulator switches and blinker units in the engine space of motor vehicles. Since such switching devices in motor vehicles have recently become more voluminous, while the connector plugs have become smaller, the connector plugs, which are combined to form connector plug units, have increases in number, and it is no longer possible to eliminate the heat generated at the power component of such switching devices solely by means of plugs which are assigned to them.

SUMMARY OF THE INVENTION

The present solution has an objective to guide out the heat which is electrically generated in the power components by means of the connector parts of the circuit device without changing the spacing of the connector parts relative to one another for this purpose.

ADVANTAGES OF THE INVENTION

The electric switching device, according to the invention has the advantage that the electrical heat generated in one or more power components is uniformly guided out by means of a plurality of connector parts, so that an accumulation of heat in the switching device, which might lead to the power switching destruction of the component, is prevented. An additional advantage is that a plurality of power switching components have a heat conducting connector with the quantity of connector parts in the form of flat plug-in prongs, for example, providing sufficient elimination of heat via individual cooling bodies, in the form of cooling plates to, which the power components are connected.

It is particularly advantageous to connect the cooling body with the connector parts by means of a thin insulating foil and a heat conducting paste. In order to limit the quantity of cooling bodies in switching devices with a plurality of power components, it is advantageous to arrange a plurality of power components on a cooling body, wherein the power component elements are fastened on the cooling body so as to be electrically insulated and so as to conduct heat in order to prevent short circuiting.

BRIEF DESCRIPTION OF THE DRAWING

Some embodiment examples of the invention are shown in the drawing and explained in more detail in the following description.

DESCRIPTION OF THE EXEMPLARY EMBODIMENTS

Figure 1:
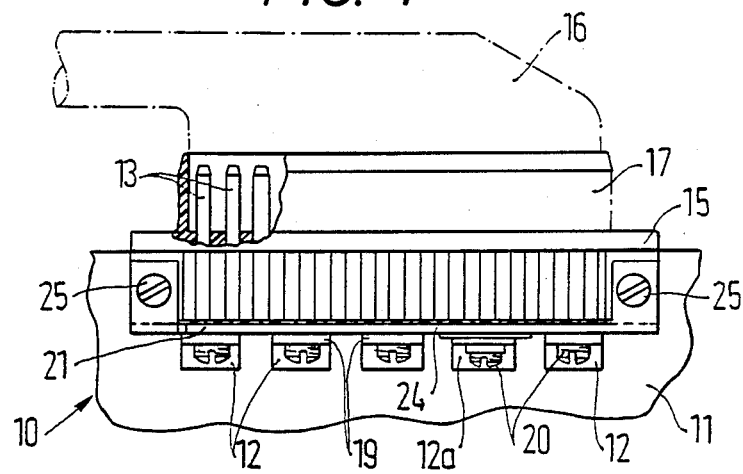
FIG. 1 shows in a sectional side view a cutaway part of the electrical switching device with a multiple-pole plug-in connector.
Figure 2:
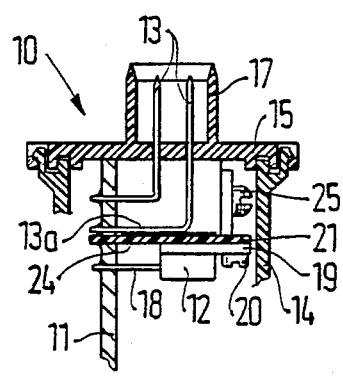
FIG. 2 shows the upper part of the switching device of FIG. 1 in longitudinal section.
Figure 3:
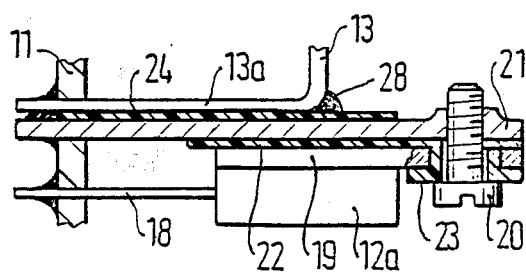
FIG. 3 shows a power switching component of the switching device of FIG. 2 with cooling plate and connector, shown on considerably enlarged scale.

FIGS. 1 to 3 show details of the upper area of an electronic switching and controlling device 10 for a motor vehicle. A printed circuit board 11 comprising a plurality of semiconductor power components 12 and a plurality of flat plug-in prongs 13 as connector parts of the device 10 are inserted in an opening of fully insulated housing 14 of plastics material provided with a connector plate 15 through which the flat plug-in prongs 13 pass in a water-right manner. The projecting ends of the flat plug-in prongs 13 are enclosed by a collar 17 for the purpose of receiving a multiple-pole cable connector 16 which is indicated by means of dots and dashes, the collar 17 being formed on the connector plate 15. The power switching components 12 are connected with the conductor paths of the printed circuit board 11 by means of connections 18 and are fastened by screws 20 at their base plates 19 to a cooling plate 21 consisting of steel or copper. If necessary, the power switching conponent 12a can also be fastened on the cooling plate 21 so as to be electrically insulated—as shown in FIG. 3—in that a thin insulating foil 22 is inserted between its base plate 19 and the cooling plate 21 and the screw 20, which is screwed into the cooling plate 21, is insulated relative to the base plate 19 by means of bushing 23 of an insulating material.

In order to eliminate the heat, which is generated in the power switching components 12, 12a and which must be guided out of the device 10, the cooling plate 21 is area connected with a plurality of flat plug-in prongs 13 so as to conduct heat and at the same time to be electrically insulated from the prongs. As shown by FIG. 2, the flat plug-in prongs 13 are arranged in two rows which lie next to one another at a distance. The front row of the flat plug-in prongs 13 lie with their end portions 13a immediately above the cooling plate 21, the end portions 13a being angled toward the printed circuit board 11. It can be seen from FIG. 3 that a thin electrically insulating foil 24 consisting of plastics material is arranged between the cooling plate 21 and the end portions 13a of the flat plug-in prongs 13. The insulating oil 24 is coated on both sides with a copper-containing or silver-containing heat conducting paste so that it forms an area connection between the cooling plate 21 and the flat plug-in prongs 13. As a result, foil 24 acts on the one hand so as to be electrically insulating and, on the other hand, so as to conduct heat. In the same way, the electrically insulating foil 22 between the power switching component 12a and the cooling plate 21 is coated with the heat conducting paste in order to ensure the electrical insulation on the one hand and the heat conduction of the other. Moreover, heat conducting paste 28 is applied between the apex of the bent portion of the flat plug-in prongs 13 and the foil 24. The cooling plate 21 is held, and possibly contacted, by the printed circuit board 11 on the one hand and is screwed on at a projection of the connector plate 15 on the other hand by means of screws 25.

Figure 4:
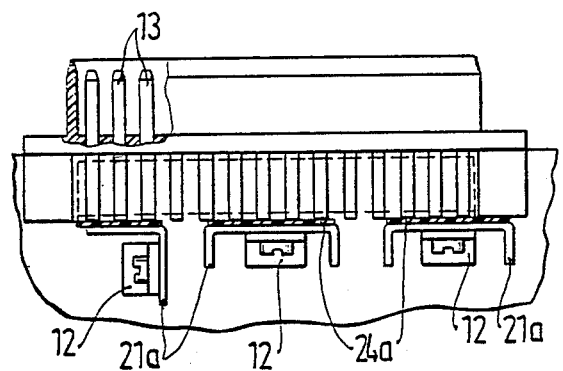
FIG. 4 shows another embodiment of components of invention with a plurality of power and a plurality of cooling plates.
Figure 5:
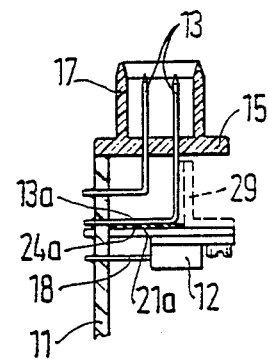
FIG. 5 shows a longitudinal section through the connection area of the switching device according to FIG. 4 in a side view.

FIGS. 4 and 5 show another exemplary embodiment of the invention in which, instead of a common cooling plate for all power switching components, three power components 12 are provided with three cooling plates 21a assigned to them. Here, also, the cooling plates 21a are area connected via thin heat conducting, electrically insulating foils 24a with bent areas 13a of a plurality of flat plug-in prongs 13.

Figure 6:
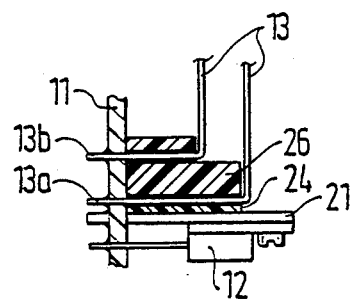
FIG. 6 shows another embodiment of the invention for a plurality of connector parts arranged one above the other.

As another embodiment example, FIG. 6 shows a solution in which the elimination of heat from the power switching components 12 is effected by means of all the flat plug-in prongs 13 of the device 10. In order to transfer the heat from the left-hand row of flat plug-in prongs to the right-hand row of flat plug-in prongs 13, a heat conducting, electrically insulating material 26, which can consist of an aluminum oxide ceramic material, a ferric oxide ceramic material or a plastics material filled with ferrite, is arranged between the bent end portions 13a, 13b of the two rows of flat plug-in prongs 13. The heat conducting, electrically insulating foil 24, which is arranged between the cooling plate 21 and the lower end portions 13a of the flat plug-in prongs 13, likewise consists of a metallic oxide ceramic or a plastics foil treated with ferrite. In this construction, the heat generated in the power component elements 12 first arrives at the lower end portions 13a of the flat plug-in prongs 13 via the cooling plate 21 and the foil 24. A portion of the heat is guided out from the housing via the flat plug-in prongs 13 of the right-hand row, while the rest of the heat reaches the adjacent end portion 13b of the left-hand row of flat plug-in prongs 13 via the heat conducting, electrically insulating material 26, located between the end areas 13a of the right-hand row and the end areas 13b of the left-hand row of flat plug-in prongs 13, and is guided outward via all these flat plug-in prongs 13.

Figure 7:
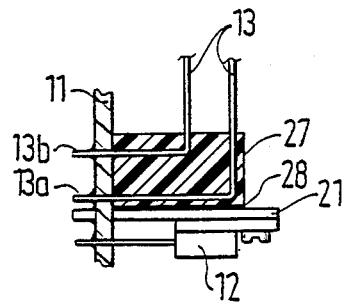
FIG. 7 shows connector parts which are embedded in heat coducting material in another exemplary embodiment of the invention.

Another embodiment example of the invention is shown in FIG. 7, according to which the bent end portions 13a, 13b of the flat plug-in prongs 13 are completely embedded in a heat conducting, electrically insulating material 27 which contacts a surface area of the cooling plate 21. The material 27 can also be a metallic oxide ceramic material or a plastic filled with ferrite. A large surface-area connection between the material 27 and the cooling plate 21, which is arranged underneath and supports the power switching components 12 is again achieved with a heat conducting paste 28 which is applied to the corresponding surfaces of the cooling plate 21 and/or the material 27 before assembly.

In addition, a shielding of the device 10 against the penetration of high-frequency interferences, which can occur via the connection lines to the flat plug-in prongs 13 of the device 10, is effected by means of embedding the end portions 13a and 13b of the flat plug-in prongs 13 in material 27 consisting of a metallic oxide ceramic material or a plastic filled with ferrite. In order to achieve a good shielding against high-frequency interferences in the constructions according to FIGS. 1 to 5, as well, the cooling plates 21, 21a can also be shaped in such a way that they enclosed the area of the flat plug-in prongs 13 located beneath the connection plate 15. The right-hand row of flat plug-in prongs 13 above the cooling plates 21a is covered by means of an additional sheet-metal angle 29 so as to conduct heat and so as to electrically insulate, as indicated in dashed lines in FIG. 5. This step further improves the shielding against high-frequency interferences as well as the elimination of heat from the power switching components 12.

We claim:

1. Switching device including at least one power switching component arranged in a completely insulated housing, comprising at least one heat conducting cooling body arranged in said housing for supporting said power switching component; a plurality of connector parts arranged opposite said cooling body and being fed through said housing; heat conducting, electrically insulating means having an area contact with said cooling body and enclosing portions of said connector parts in said housing to establish a path for abducting out of said housing the heat generated by said power switching component.

2. Switching device according to claim 1 wherein a plurality of power switching components is mounted in contact with said at least one cooling body.

3. Switching device according to claim 1 wherein a thin foil of an electrically insulating material is provided between said cooling body and said power switching component.

4. Switching device according to claim 1 wherein said heat conducting, electrically insulating means includes a high-frequency shielding material.

5. Switching device according to claim 4 wherein said heat conducting, electrically insulating means is of a plastic filled with ferrite.

6. Switching device according to claim 4 wherein said heat conducting, electrically insulating means is of a metallic oxide ceramic.

7. Switching device according to claim 1 wherein said heat conduction, electrically insulating means includes a thin foil (24) having an area contact with said cooling body.

8. Switching device according to claim 7 wherein said foil is of a plastic filled with ferrite.

9. Switching device according to claim 7 wherein said foil is of a metallic oxide ceramic.

10. Switching device according to claim 1 wherein said cooling body partially surrounds said connector parts to shield the same against high-frequency radiation.

* * * * *